US011905591B2

(12) United States Patent
Stańczak et al.

(10) Patent No.: US 11,905,591 B2
(45) Date of Patent: Feb. 20, 2024

(54) METHOD OF DECREASING A SHEET RESISTANCE OF A TRANSPARENT CONDUCTOR AND A METHOD OF FORMING A MULTILAYER TRANSPARENT CONDUCTOR

(71) Applicant: XTPL S.A., Wrocław (PL)

(72) Inventors: Anna Stańczak, Oleśnica (PL); Jolanta Gadzalińska, Działoszyn (PL); Mateusz Łysień, Żywiec, woj. śląskie (PL); Aneta Wiatrowska, Wrocław (PL); Filip Granek, Mrozów (PL)

(73) Assignee: XTPL S.A., Wrocław (PL)

( * ) Notice: Subject to any disclaimer, the term of this patent is extended or adjusted under 35 U.S.C. 154(b) by 186 days.

(21) Appl. No.: 17/202,226

(22) Filed: Mar. 15, 2021

(65) Prior Publication Data

US 2021/0285091 A1    Sep. 16, 2021

Related U.S. Application Data

(60) Provisional application No. 62/989,923, filed on Mar. 16, 2020.

(51) Int. Cl.
*C23C 14/35* (2006.01)
*C23C 14/08* (2006.01)
*C04B 35/457* (2006.01)

(52) U.S. Cl.
CPC ............ *C23C 14/35* (2013.01); *C04B 35/457* (2013.01); *C23C 14/086* (2013.01); *C04B 2235/3293* (2013.01)

(58) Field of Classification Search
CPC ........ H10K 30/82; H10K 30/83; C23C 14/35; C23C 14/086
See application file for complete search history.

(56) References Cited

U.S. PATENT DOCUMENTS

| | | | | |
|---|---|---|---|---|
| 7,294,395 | B2* | 11/2007 | Itoh | B32B 27/06 428/323 |
| 8,795,462 | B2* | 8/2014 | Garbar | H01L 33/42 252/502 |
| 9,750,131 | B2* | 8/2017 | Seong | H05K 1/0274 |
| 10,051,731 | B2* | 8/2018 | Hwang | H10K 30/83 |
| 2007/0128905 | A1* | 6/2007 | Speakman | H05K 1/0265 257/E31.126 |

* cited by examiner

*Primary Examiner* — Michael P Wieczorek
(74) *Attorney, Agent, or Firm* — K&L Gates LLP

(57) ABSTRACT

A method of decreasing a sheet resistance of a transparent conductor is disclosed. The method includes the following: forming a first transparent conductor layer on a substrate; dispensing a metallic nanoparticle composition on the first transparent conductor layer to form metallic nanoparticle features; and sintering at least the first transparent conductor layer and the metallic nanoparticle features. The first transparent conductor layer includes a crystalline metal oxide. The aperture ratio of the transparent conductor is in a range of 90% to 99%.

A multilayer transparent conductor and a method of forming a multilayer transparent conductor are also disclosed.

19 Claims, 9 Drawing Sheets

METHOD OF DECREASING A SHEET RESISTANCE OF A TRANSPARENT CONDUCTOR AND A METHOD OF FORMING A MULTILAYER TRANSPARENT CONDUCTOR

CROSS-REFERENCE TO RELATED APPLICATION

This application claims benefit under 35 U.S.C. § 119 (e) to U.S. Provisional Application No. 62/989,923, filed Mar. 16, 2020, entitled "METHOD OF DECREASING A SHEET RESISTANCE OF A TRANSPARENT CONDUCTOR AND A METHOD OF FORMING A MULTILAYER TRANSPARENT CONDUCTOR," the entire disclosure of which is hereby incorporated by reference herein.

BACKGROUND

Transparent conductors are thin-film materials that are characterized by high optical transmission (typically 80% or greater in the visible spectral range of 400 nm to 700 nm) and relatively high electrical conductivity. Transparent conductors are used in various applications including flat panel displays, touch sensors, solar cells, and electrochromic windows. Indium-tin oxide (ITO) in crystalline form is a widely used transparent conductor. ITO films on glass substrates characterized by sheet resistance of 100 Ω/sq or less are commercially available. Indium-zinc oxide (IZO) can also be used as a transparent conductor. ITO and IZO are examples of metal oxides.

A limitation of conventional transparent conductors such as ITO and IZO is that they tend to degrade under high temperature processing in a temperature range of 350° C. to 450° C. The sheet resistance would increase significantly as a result of such degradation. Therefore, transparent conductors that can better withstand high temperature treatment while achieving lower sheet resistance are desired.

SUMMARY OF THE INVENTION

In one aspect, a method of decreasing a sheet resistance of a transparent conductor is disclosed. The method includes the following: forming a first transparent conductor layer on a substrate; dispensing a metallic nanoparticle composition on the first transparent conductor layer to form metallic nanoparticle features; and sintering at least the first transparent conductor layer and the metallic nanoparticle features. The first transparent conductor layer includes a crystalline metal oxide. The aperture ratio of the transparent conductor is in a range of 90% to 99%.

In another aspect, a method of forming a multilayer transparent conductor is disclosed. The method includes the following: forming a first transparent conductor layer on a substrate; dispensing a metallic nanoparticle composition on the first transparent conductor layer to form metallic nanoparticle features; sintering at least the first transparent conductor layer and the metallic nanoparticle features; and forming a second transparent conductor layer overlying the metallic nanoparticle features. The first and second transparent conductor layers include crystalline metal oxide(s). The aperture ratio of the multilayer transparent conductor is in a range of 90% to 99%.

In yet another aspect, a multilayer transparent conductor is disclosed. The multilayer transparent conductor includes a first transparent conductor layer; metallic nanoparticle features overlying the first transparent conductor layer; and a second transparent conductor layer overlying the metallic nanoparticle features. The first and second transparent conductor layers include crystalline metal oxide(s). The aperture ratio of the multilayer transparent conductor is in a range of 90% to 99%.

The above summary of the present invention is not intended to describe each disclosed embodiment or every implementation of the present invention. The description that follows more particularly exemplifies illustrative embodiments. In several places throughout the application, guidance is provided through examples, which examples can be used in various combinations. In each instance of a list, the recited list serves only as a representative group and should not be interpreted as an exclusive list.

BRIEF DESCRIPTION OF THE FIGURES

The disclosure may be more completely understood in consideration of the following detailed description of various embodiments of the disclosure in connection with the accompanying drawings, in which.

DETAILED DESCRIPTION OF ILLUSTRATIVE EMBODIMENTS

The present disclosure relates to method of decreasing a sheet resistance of a transparent conductor, a method of forming a multilayer transparent conductor, and a multilayer transparent conductor.

In this disclosure:

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the invention.

The terms "comprises" and variations thereof do not have a limiting meaning where these terms appear in the description and claims.

Unless otherwise specified, "a," "an," "the," and "at least one" are used interchangeably and mean one or more than one.

The recitations of numerical ranges by endpoints include all numbers subsumed within that range (e.g., 1 to 5 includes 1, 1.5, 2, 2.75, 3, 3.80, 4, 5, etc.).

For any method disclosed herein that includes discrete steps, the steps may be conducted in any feasible order. As appropriate, any combination of two or more steps may be conducted simultaneously.

Figure 1:
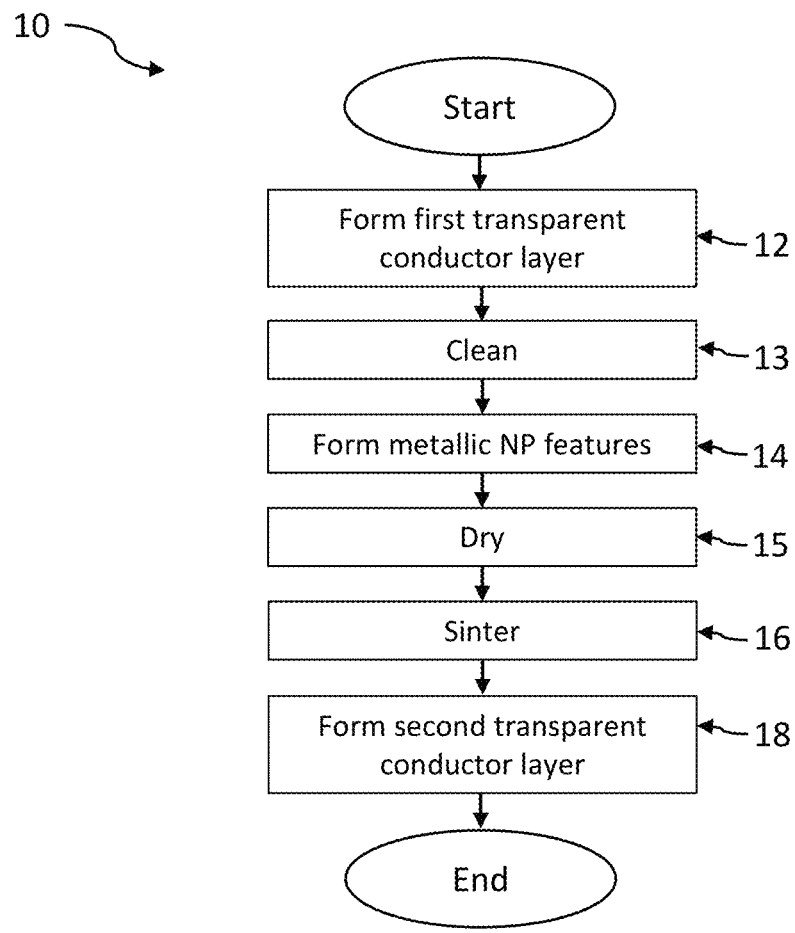
FIG. 1 is a flow diagram of a method of decreasing a sheet resistance of a transparent conductor and a method of forming a multilayer transparent conductor.

FIG. 1 is a flow diagram of a method 10 of forming a multilayer transparent conductor or a method of decreasing a sheet resistance of a transparent conductor. At step 12, a first transparent conductor layer is formed on a substrate. Examples of suitable substrates are: glass substrates, plastic substrates (plastic films), capacitive touch screen panels, liquid crystal display (LCD) panels, and organic light-emitting diode (OLED) display panels. In the examples described hereinbelow, the substrates used are glass substrates. At step 12, it is not necessary that the first transparent conductor layer be formed on a bare substrate. For example, the first transparent conductor can be formed on a glass substrate that already has a silicon nitride layer, a silicon oxide layer, a polymer layer, a semiconductor layer, or a conductor layer thereon.

Figure 7:
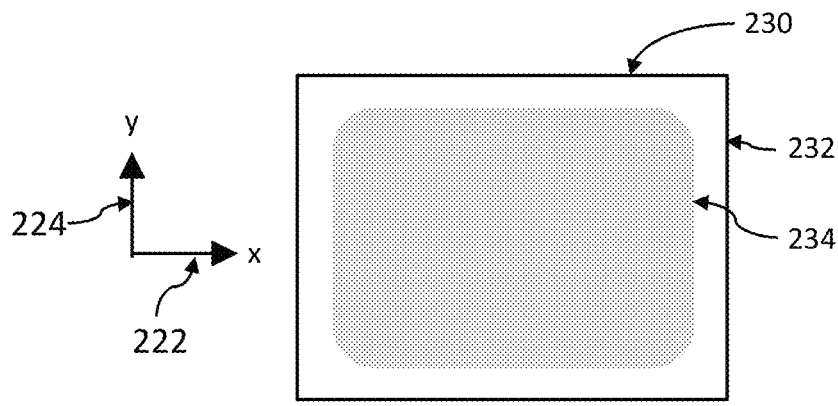
FIG. 7 is a schematic top view of a first transparent conductor layer on a glass substrate.

The first transparent conductor layer formed at step 12 includes a first crystalline metal oxide. Preferably, the first crystalline metal oxide is crystalline indium-tin oxide (c-ITO) or crystalline indium-zinc oxide (c-IZO). Crystalline indium-tin oxide or crystalline indium-zinc oxide can be deposited on a substrate by radio frequency (RF) magnetron sputtering. Alternatively, c-ITO (or c-IZO) can be formed by depositing amorphous indium-tin oxide (or amorphous indium-zinc oxide) on a substrate by PVD (physical vapor deposition) evaporation and converting the amorphous indium-tin oxide (or amorphous indium-zinc oxide) to crystalline indium-tin oxide (or crystalline indium-zinc oxide) by heating. This conversion to c-ITO (or c-IZO) requires heating in excess of 200° C. A thickness of the first transparent conductor is preferably in a range of 10 nm to 1000 nm. FIG. 7 is a schematic top view of a sample 230 upon conclusion of step 12. At this time, the sample 230 consists of a glass substrate 232 and the first transparent conductor layer 234 overlying a glass substrate 232. At step 13, the sample 230 is cleaned. A preferred cleaning procedure includes ultrasonication in a bath of isopropanol for 30 minutes.

At step 14, metallic nanoparticle features are formed by dispensing a metallic nanoparticle composition on the first transparent conductor layer. Preferably, the metallic nanoparticle composition includes copper nanoparticles or silver nanoparticles. We may sometimes refer to a metallic nanoparticle composition as an ink or a paste. The metallic nanoparticles are preferably capped (covered) with polyvinylpyrrolidone (PVP) which has been found to be effective as a dispersant. In our experience, the average diameter of copper nanoparticles can range between 60 nm and 150 nm. The concentration of metallic nanoparticles in the metallic nanoparticle composition can range between 58 wt % and 82 wt %. The metallic nanoparticles are dispersed in a solvent or solvent mixture. We have used solvent mixtures containing polyols. Examples of polyols useful in solvent mixtures are: ethylene glycol, propylene glycol, diethylene glycol, 2-butoxyethanol, and glycerol. The metallic nanoparticle composition can additionally include dispersant additives in a range of 0.2 wt % to 5.0 wt %. The metallic nanoparticle compositions have viscosities ranging between $5 \times 10^2$ cP and $1 \times 10^6$ cP. Additionally, the metallic nanoparticle composition can include titanium precursor compounds that improve the capability of the transparent conductor to withstand high-temperature processing. The titanium precursor compound can be a titanium alkoxide. Examples of titanium alkoxide are titanium(IV) butoxide (abbreviated TBT) and Titanium(IV) isopropoxide (abbreviated TTIP). Metallic nanoparticle compositions preferably contain a titanium alkoxide compound at a concentration in a range of 0.2 wt % to 5.0 wt %.

The metallic nanoparticle features can be dispensed using a fluid printing apparatus, as described hereinbelow. The metallic nanoparticle features can be metallic nanoparticle lines. Using a stainless-steel needle (stainless steel capillary tube) with an opening diameter of 35 μm, metallic nanoparticle lines of line widths ranging between 30 μm and 50 μm are obtained, depending upon deposition conditions. Using a glass capillary tube with an opening diameter of 20 μm, metallic nanoparticle lines of line widths ranging between 3 μm and 4 μm are obtained, depending upon deposition conditions. Generally, metallic nanoparticle lines having line widths ranging between 3 μm and 50 μm are formed.

At step 15, the sample is dried. Samples can be dried in an atmosphere of air or in a protective atmosphere such as nitrogen. Samples can be dried in two stages: (1) in 70° C. for 10 min; and (2) in 130° C. for 10 min, for a total drying time of 20 min. In an atmosphere of nitrogen, samples can be dried in one stage: in 150° C. for 15 min.

At step 16, the sample 230 (at least the first transparent conductor layer and the metallic nanoparticle feature) is sintered. The sintering can be photonic sintering or thermal sintering. Thermal sintering is carried out by heating in an oven in a protective atmosphere. Typically, the oven temperature is controlled within a range of 350° C. to 450° C. Examples of protective atmospheres are: Argon, Nitrogen, and a mixture of Hydrogen (5 vol. %) and Nitrogen (95 vol. %). Photonic sintering can be carried out using a laser or a flash lamp. If a laser is used, emission wavelengths of 1064 nm and 532 nm have been effective. The laser can be operated in continuous-wave mode or pulsed mode.

Figure 8:
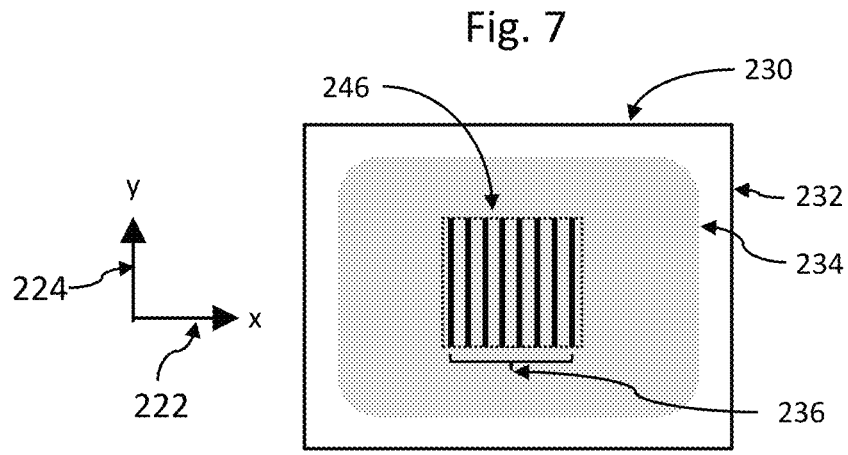
FIG. 8 is a schematic top view of a stack including metallic nanoparticle lines and a first transparent conductor layer.

FIG. 8 is a schematic top view of a sample 230 upon completion of step 14, 15, or 16. Sample 230 includes a bilayer stack 246 marked by dotted lines. Bilayer stack 246 includes a cluster of metallic nanoparticle lines 236 overlying the first transparent conductor layer 234. In the example shown, each of the metallic nanoparticle lines 236 extend along the y-direction (224).

Samples were prepared in accordance with steps 12, 13, 14, 15, and 16 of method 10 (FIG. 1). A crystalline indium-tin oxide layer (first transparent conductor layer, thickness approximately 300 nm) was deposited on a glass substrate by RF magnetron sputtering (step 10). The sheet resistance of the c-ITO layer was measured by 4-point probe method and found to be 18.2 Ω/sq. The sample (c-ITO and glass substrate) was then cleaned by ultrasonication in isopropanol for 30 minutes (step 13). Clusters of metallic nanoparticle lines were dispensed on the c-ITO-coated substrate, with each cluster having lateral dimensions of approximately 1 cm by 1 cm. The metallic nanoparticle lines were dispensed from the nozzle onto the substrate under an applied pressure of 0 mbar (sample 2) or 25 mbar (all samples other than sample 2). Each cluster contained approximately 21 metallic nanoparticle lines each approximately 1 cm long. Metallic nanoparticle lines were dispensed using stainless-steel needles having an inner nozzle diameter of 35 μm. The clusters were spaced apart from each other and each cluster had different conditions at step 14 (metallic nanoparticle composition or its deposition) or step 16 (sintering). After deposition of clusters of metallic nanoparticle lines (step 14), the samples were dried in air at 70° C. for 10 min and then in 130° C. for 10 min (step 15). After drying the samples were sintered by photonic sintering (step 15). Sheet resistance at each bilayer stack was measured after the sintering step (step 16). Sheet resistance was measured by a 4-point probe method.

Sheet resistance measurement results for bilayer stacks of metallic nanoparticle lines and first transparent conductor layer (c-ITO) prepared under different conditions are summarized in Table 1. In all bilayer stacks, the sheet resistance of the sample after sintering was 6 Ω/sq or less, whereas the sheet resistance of the first transparent conductor layer (c-ITO layer in these cases) was 18.2 Ω/sq. The reduction in sheet resistance (by addition of metallic nanoparticle lines followed by sintering) ranged between approximately 67% and 81%. All of the metallic nanoparticle lines were formed from metallic nanoparticle compositions containing copper nanoparticles. The metallic nanoparticle compositions contained propylene glycol as a solvent. Samples 1 and 2 were formed using metallic nanoparticle compositions additionally containing a titanium(IV) butoxide (abbreviated TBT). The concentration of TBT in the metallic nanoparticle composition was approximately 0.8 wt %. For metallic nanoparticle compositions containing TBT, the copper nanoparticle concentration was 70 wt %. For metallic nanoparticle compositions containing no TBT, the copper nanoparticle concentration was approximately 71 wt %.

The laser sintering (photonic sintering) was carried out in an atmosphere of nitrogen (samples 6 and 9) or air. In the examples shown (Table 1), photonic sintering was carried out using a laser emitting at 1064 nm and operating in continuous-wave mode. The output power was approximately 0.5 W and the beam size at the sample was approximately 200 μm. The laser was scanned along the x-axis (222) whereas the metallic nanoparticle lines extend approximately along the y-axis (224). The laser was scanned in a direction approximately perpendicular to the direction in which the metallic nanoparticle lines 236 extend. For each scan of the laser beam, the beam overlap was approximately 90%. The scan speed of the laser ranged between 50 mm/sec and 150 mm/sec.

Figure 10:
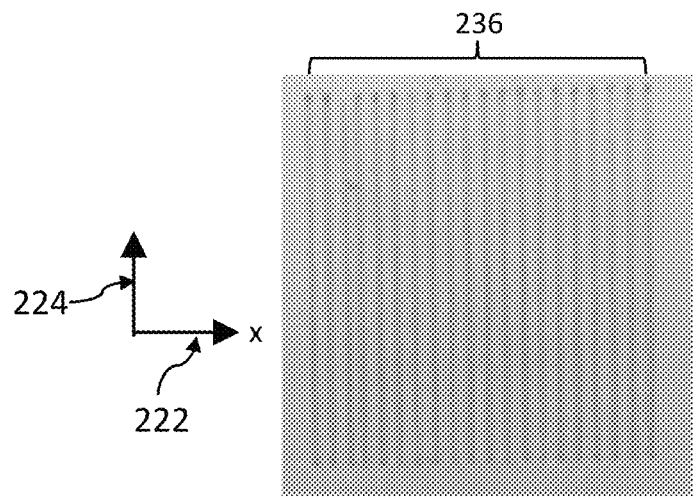
FIG. 10 is a photograph (topographical view) of a cluster of copper nanoparticle lines on a crystalline indium-tin oxide (ITO) layer.
Figure 11:
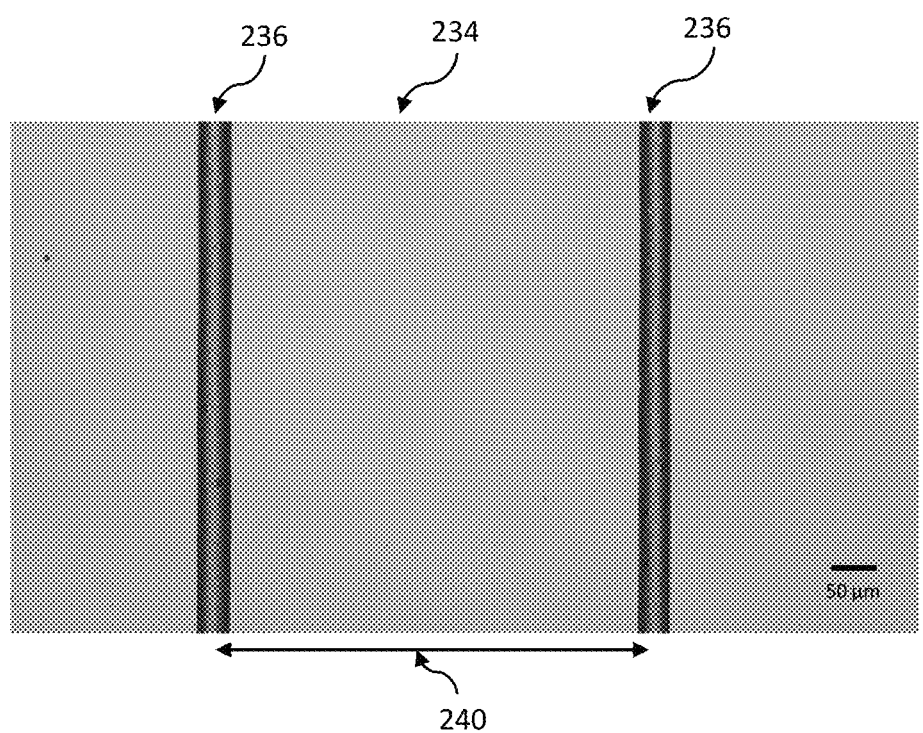
FIG. 11 is an optical microscope topographical view of a portion of the cluster of copper nanoparticle lines on a crystalline indium-tin oxide (ITO) layer, as shown in FIG. 10.
Figure 12:
FIG. 12 is a scanning electron microscope (SEM) topographical view of a copper nanoparticle line on a crystalline indium-tin oxide (ITO) layer.

FIG. 10 is a photograph of the sample 9 (Table 1) which exhibited a sheet resistance of 3.4 Ω/sq after the sintering step (step 16). A cluster of copper nanoparticle lines on a first transparent conductive layer of c-ITO is shown. The laser was scanned along the x-axis (222) whereas the metallic nanoparticle lines extend approximately along the y-axis (224). FIG. 11 is an optical microscope topographical view of a portion of the bilayer stack shown in FIG. 10. Portions of two adjacent metallic nanoparticle lines 236 and the first transparent conductor layer 234 are visible. FIG. 12 is an SEM topographical view of a copper nanoparticle line on a c-ITO layer, after sintering (step 16). The metallic nanoparticle lines are copper nanoparticle lines and the first transparent conductor layer is a c-ITO layer. The metallic nanoparticle lines are formed parallel to each other; hence there is a pitch 240 which is a distance between adjacent metallic nanoparticle lines. An aperture ratio can be defined as a fraction of the area of the first transparent conductor layer which is not obscured by the metallic nanoparticle features. Accordingly, in the case of parallel metallic nanoparticle lines having a line width w and separated by a pitch p, the aperture ratio A can be calculated as: $A = 1 - w/p$ (Eq. 1). The line width w is indicated as reference numeral 242 in FIG. 12. The aperture ratio of each sample is listed in Table 1. The aperture ratios range between 91.8% and 93.7%. In order to obtain a high optical transmission, the aperture ratio should be as large as possible. On the other hand, in order to obtain the observed reduction in sheet resistance of 67% or greater, metallic nanoparticle features must be formed on the first transparent conductor layer at sufficient density. For example, a pitch between adjacent metallic nanoparticle lines can be in a range of 100 μm to 1000 μm. In cases where the metallic nanoparticle (silver or copper) line widths are in a range of 3 μm to 5 μm, a pitch of 250 μm (or less) was found to be suitable for obtaining reduced sheet resistance. Accordingly, for line widths ranging between 3 μm and 5 μm and a pitch of 250 μm, aperture ratios ranging between approximately 98% and 99% are obtained. In cases where the metallic nanoparticle (silver or copper) line widths are approximately 50 μm, a pitch of 500 μm (or less) was found to be suitable for obtaining reduced sheet resistance. Accordingly, for line widths of approximately 50 μm and a pitch of 500 μm, aperture ratios of approximately 90% are obtained. Therefore, the aperture ratio of the transparent conductor (stack of metallic nanoparticle features and first transparent conductor layer) is preferably in a range of 90% to 99%.

For the samples summarized in Table 1, sheet resistance of the bilayer (Rs_Bilayer) (Cu nanoparticle lines on c-ITO, after sintering) ranged between 3.4 Ω/sq and 6.0 Ω/sq,

TABLE 1

| # | Additive | NP Conc. (wt %) | Pressure (mbar) | Line Width (μm) | Aperture ratio | Laser Sinter Atmosphere | Laser Scan Speed (mm/sec) | Rs_Bilayer (Ω/sq) | Rs Reduction | Rs_HighTemp (Ω/Sg) |
|---|---|---|---|---|---|---|---|---|---|---|
| 1 | TBT 0.8% | 70 | 25 | 34.2 | 93.2% | Air | 60 | 6.0 | 67% | 18.5 |
| 2 | TBT 0.8% | 70 | 0 | 40.8 | 91.8% | Air | 50 | 3.8 | 79% | 14.0 |
| 3 | | 71 | 25 | 33.3 | 93.3% | Air | 150 | 5.4 | 70% | 40.0 |
| 4 | | 71 | 25 | 40.1 | 92.0% | Air | 100 | 5.3 | 71% | 29.0 |
| 5 | | 71 | 25 | 39.2 | 92.2% | Air | 80 | 5.0 | 73% | 18.0 |
| 6 | | 71 | 25 | 32.5 | 93.5% | Nitrogen | 80 | 4.5 | 75% | 34.0 |
| 7 | | 71 | 30 | 31.7 | 93.7% | Air | 70 | 5.9 | 68% | 19.0 |
| 8 | | 71 | 25 | 42.5 | 91.5% | Air | 65 | 3.9 | 79% | 32.0 |
| 9 | | 71 | 25 | 34.2 | 93.2% | Nitrogen | 70 | 3.4 | 81% | 25.0 | which corresponds to a reduction in sheet resistance ranging between 67% and 81% from the initial sheet resistance of the c-ITO (18.2 Ω/sq). This reduction in sheet resistance is listed in Table 1 under Rs Reduction. No anisotropy was observed in the sheet resistance after sintering (step 16) even though all of the metallic nanoparticle lines extend approximately parallel to one axis (y-axis 224 in FIG. 10). No significant improvement in sheet resistance was observed in bilayer stack samples having metallic nanoparticle lines formed in two directions (along the x- and y-axes) compared to bilayer stack samples having metallic nanoparticle lines formed in one direction. Accordingly, the formation of the metallic nanoparticle features on the first transparent conductor layer and sintering of the at least the first transparent conductor layer and the metallic nanoparticle features can be regarded as steps in decreasing a sheet resistance of a transparent conductor.

Figure 9:
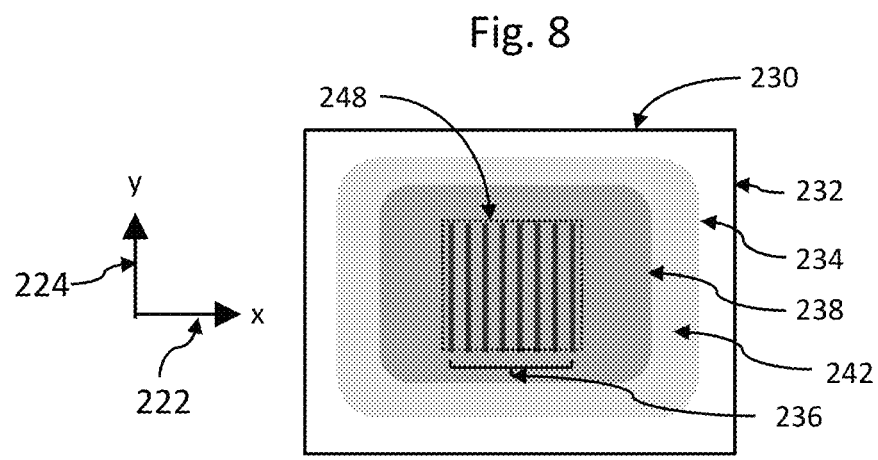
FIG. 9 is a schematic top view of a multilayer transparent conductor including a second transparent conductor, metallic nanoparticle lines, and the first transparent conductor.

A limitation of conventional transparent conductors such as ITO and IZO is that they tend to degrade under high temperature processing, such as temperatures in a range of 350° C. to 450° C. Since transparent conductors are subject to subsequent processing under varying conditions, transparent conductors that can better withstand high temperature treatment while achieving low sheet resistance are desired. The process 10 shown in FIG. 1 additionally includes a step 18 of forming a second transparent conductor layer overlying the metallic nanoparticle features. The second transparent conductor layer comprises a second crystalline metal oxide. Preferably, the second crystalline metal oxide is crystalline indium-tin oxide (c-ITO) or crystalline indium-zinc oxide (c-IZO). Crystalline indium-tin oxide or crystalline indium-zinc oxide can be deposited on a substrate by radio frequency (RF) magnetron sputtering. Alternatively, c-ITO (or c-IZO) can be formed by depositing amorphous indium-tin oxide (or amorphous indium-zinc oxide) on a substrate by PVD (physical vapor deposition) evaporation and converting the amorphous indium-tin oxide (or amorphous indium-zinc oxide) to crystalline indium-tin oxide (or crystalline indium-zinc oxide) by heating. This conversion to c-ITO (or c-IZO) requires heating in excess of 200° C. A thickness of the second transparent conductor is preferably in a range of 50 nm to 600 nm. FIG. 9 is a schematic top view of a transparent conductor 230 upon conclusion of step 18. The transparent conductor 230 consists of the first transparent conductor layer 234, metallic nanoparticle features 236, and a second transparent conductor layer 236. Upon conclusion of step 18, the transparent conductor 230 can also be referred to as a multilayer transparent conductor.

For the samples listed in Table 1, a crystalline indium-tin oxide layer (second transparent conductor layer, thickness approximately 300 nm) was deposited by RF magnetron sputtering (step 18). Upon conclusion of step 18, the samples listed in Table 1 exhibited sheet resistance values of approximately 1 Ω/sq, which is lower than the bilayer stack sheet resistance values reported in Table 1. Accordingly, step 18 of forming a second transparent conductor layer can be regarded as an optional step of a method of decreasing a sheet resistance of a transparent conductor. Additionally, steps 12, 13, 14, 15, 16, and 18 are steps in a method of forming a multilayer transparent conductor.

Upon conclusion of step 18, the samples were subjected to a high-temperature treatment in an oven at 350° C. for 90 minutes in air. After the high-temperature treatment, the sheet resistance of regions that contained the first transparent conductor layer only and no second transparent conductor layer and no metallic nanoparticle features (shown as region 242 in FIG. 9) was measured to be greater than 100 Ω/sq. The sheet resistances of multilayer samples (identified as 248 in FIG. 9) containing the first transparent conductor layer, a cluster of the metallic nanoparticle lines, and the second transparent conductor layer were measured after high-temperature treatment. The sheet resistance of multilayer transparent conductor samples after high-temperature treatment (Rs_HighTemp in Table 1) ranged between 14 Ω/sq and 40 Ω/sq. Therefore, the multilayer transparent conductor comprising a metallic nanoparticle features is better able to withstand a high-temperature treatment than a transparent conductor containing c-ITO and containing no metallic nanoparticle features.

Figure 13:
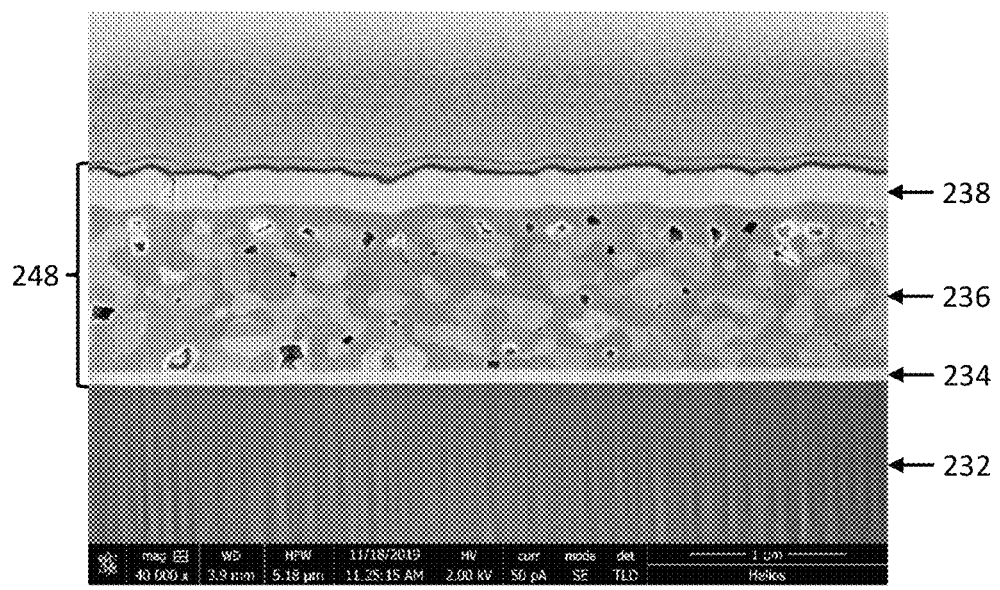
FIG. 13 is a scanning electron microscope (SEM) view of a focused-ion beam (FIB) cross section of a multilayer transparent conductor.

FIG. 13 is an SEM view of a cross section of an example multilayer transparent conductor 248. There is a first transparent conductor layer 234 of c-ITO on the glass substrate 232. Thickness of the first transparent conductor layer 234 is approximately 100 nm. A metallic nanoparticle line 236 comprising copper nanoparticles is shown overlying the first transparent conductor layer 234. The metallic nanoparticle line 236 is approximately 1.4 μm thick. A second transparent conductor layer 238 of c-ITO is overlying the metallic nanoparticle line 236. Thickness of the second transparent conductor layer 238 is approximately 300 nm. The example shown was subject to photonic sintering (step 16) after formation of the metallic nanoparticle lines 236. The packing density is quite high and the porosity is quite low in the metallic nanoparticle line 236. As a result, it is possible to form the second transparent conductor layer overlying the metallic nanoparticle features with no cracks or discontinuities. While the post-high temperature treatment sheet resistance values are higher than the bilayer sheet resistance values achieved after sintering (Rs_Bilayer), a multilayer structure, such as shown in FIG. 13, is better able to withstand a high-temperature treatment than a transparent conductor structure devoid of metallic nanoparticle features.

Figure 2:
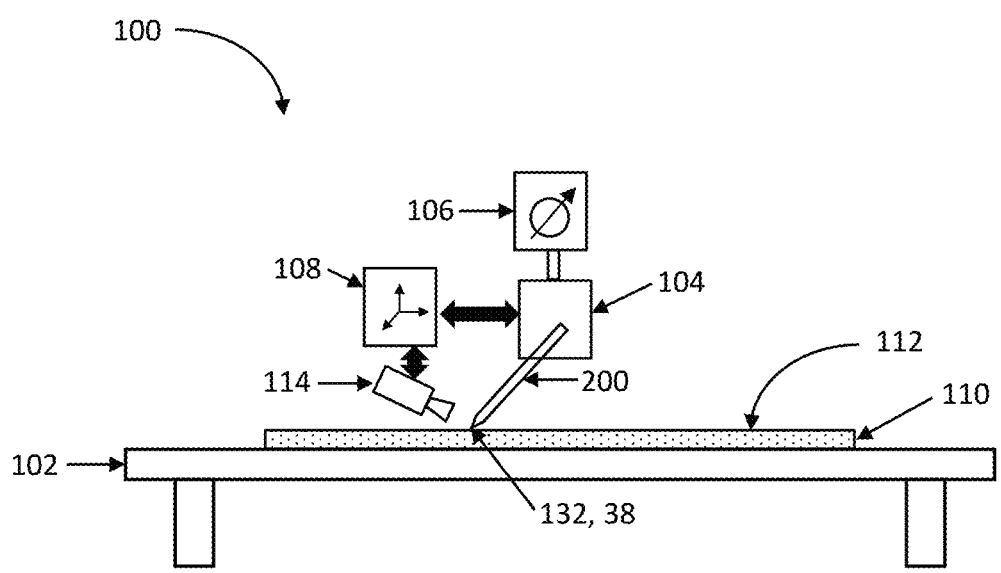
FIG. 2 is a block diagram view of an illustrative fluid printing apparatus.

An illustrative fluid printing apparatus is explained with reference to FIG. 2. FIG. 2 is a block diagram view of an illustrative fluid printing apparatus. The fluid printing apparatus 100 includes a substrate stage 102, a print head 104, a pneumatic system 106, and a print head positioning system 108. The fluid printing apparatus 100 can also include an imaging system 114, electronically coupled to the print head positioning system 108. A substrate 110 is fixed in position on the substrate stage 102 during the printing (dispensing) and has a printable surface 112, which is facing upward and facing towards the print head 104. The print head 104 is positioned above the substrate 110. The print head includes a nozzle 200, and the nozzle 200 includes an outlet 132.

Figure 3:
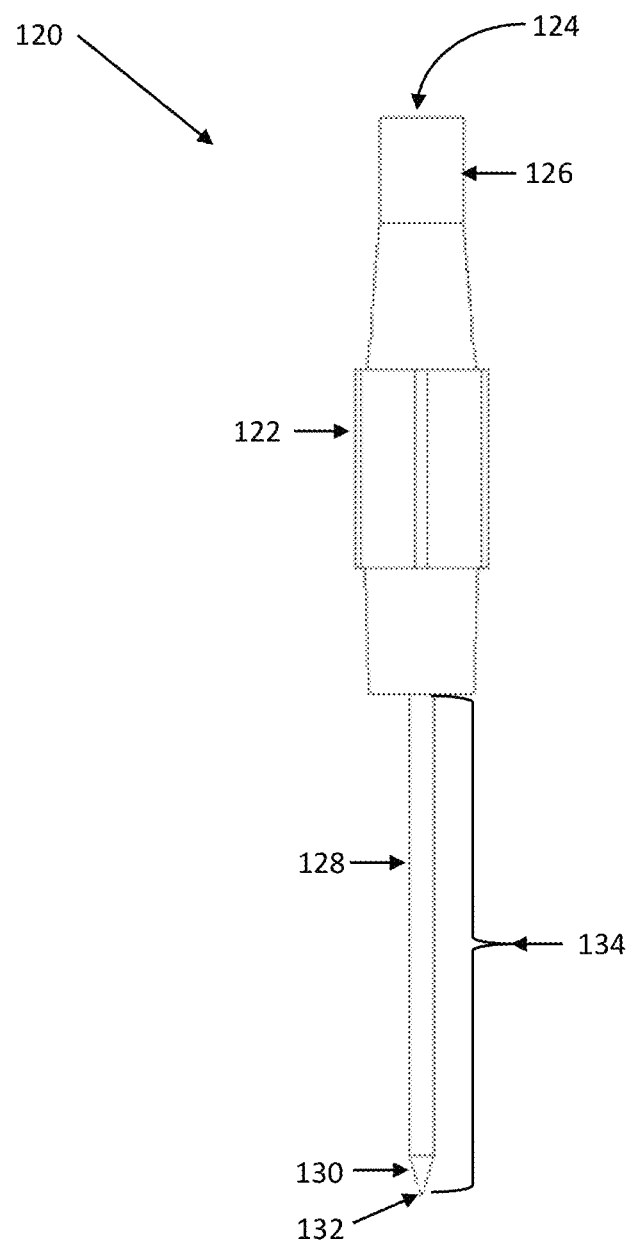
FIG. 3 is a schematic side view of a capillary glass tube.

The print head includes a nozzle. Commercially available capillary glass tubes can be used as a nozzle. For example, capillary glass tubes (Eppendorf™ Femtotips™ II Microinjection Capillary Tips), having an inner diameter at the tip of 0.5 μm and an outer diameter at the tip of 0.7 μm, are available from Fisher Scientific. A commercially available capillary glass tube 120 is shown schematically in FIG. 3. The capillary glass tube has an inlet 124, and outlet 132, and an elongate fluid passageway (capillary glass tube 120) between the inlet 124 and outlet 132. A plastic handle 122 is attached to the capillary glass tube 120 around its circumference. The plastic handle 122 includes an inlet (input end) 124 and a threaded portion 126 near the inlet 124 which enables a threaded connection to an external body or external conduit (not shown in FIG. 3). The inlet 124 has an inner diameter of 1.2 mm.

The capillary glass tube includes an elongate input portion 128 and a tapering portion 130. There is an externally visible portion 134 of the capillary glass tube 120. Some of the elongate input portion 128 may be obscured by the surrounding plastic handle 122. The tapering portion 130 tapers to an outlet (output end) 132 (having an inner diameter of 0.5 m and an outer diameter at the tip of 0.7 μm in the case of the certain Femtotips™ II Microinjection Capillary Tips).

Figure 4:
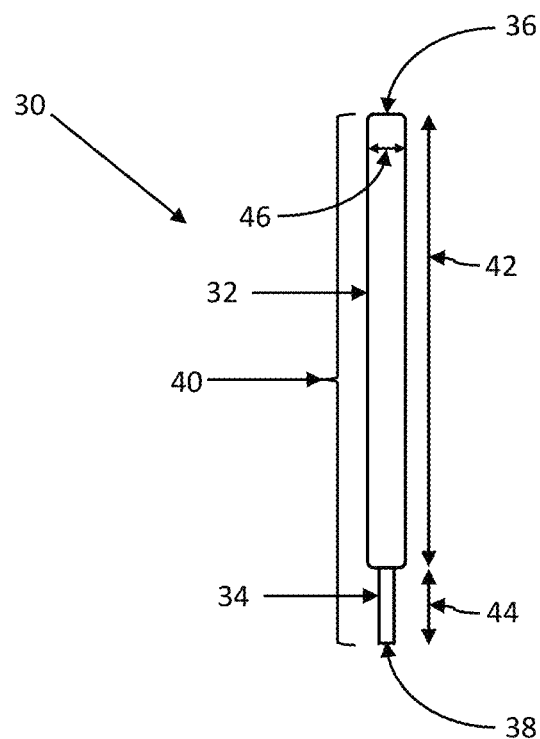
FIG. 4 is a schematic side view of a stainless-steel needle.
Figure 5:
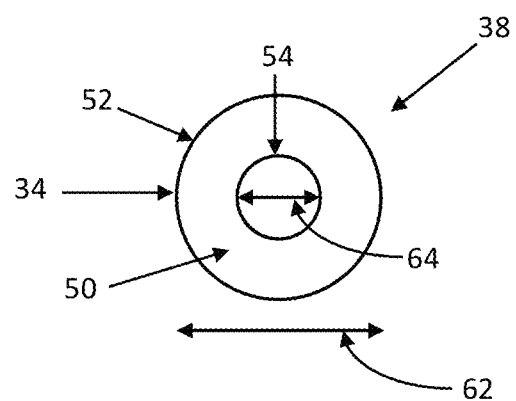
FIG. 5 is a schematic bottom view of the tip portion of the stainless-steel needle of FIG. 9.

Commercially available stainless-steel needles can also be used as nozzles. For example, stainless-steel needles called NanoFil™ Needles, are available from World Precision Instruments. Needle part numbers NF35BL-2 and NF36BL-2 have been used. A side view of stainless-steel needle 30 is shown schematically in FIG. 4. Needle 30 has an inlet 36, which is attached to a syringe during operation, an outlet 38, and an elongate fluid passageway portion 40 between the inlet 36 and outlet 38. The fluid passageway portion 40 includes a shank portion 32, which includes the inlet 36, and a tip portion 34, which includes the outlet 38. A length 42 of the shank portion is 30 mm and an outer diameter 46 of the shank portion is 460 μm. A length 44 of the tip portion is 5 mm (for NF35BL-2) or 3 mm (for NF36BL-2). FIG. 5 is a bottom schematic view of the tip portion 34, showing outlet 38 in greater detail. The needle tip portion 34 has an outer wall 52, characterized by an outer diameter 62, and an inner wall 54, characterized by an inner diameter 64. The outer diameter 62 is 135 μm (for NF35BL-2) or 120 μm (for NF36BL-2). The inner diameter 64 is 55 μm (for NF35BL-2) or 35 μm (for NF36BL-2). The latter needle NF36BL-2 was used for dispensing the nanoparticle features listed in Table 1. Stainless steel capillary tube 30 (with outlet 38) or glass capillary tube 120 (with outlet 132) can be used as nozzle 200 in the fluid printing apparatus 100.

Figure 6:
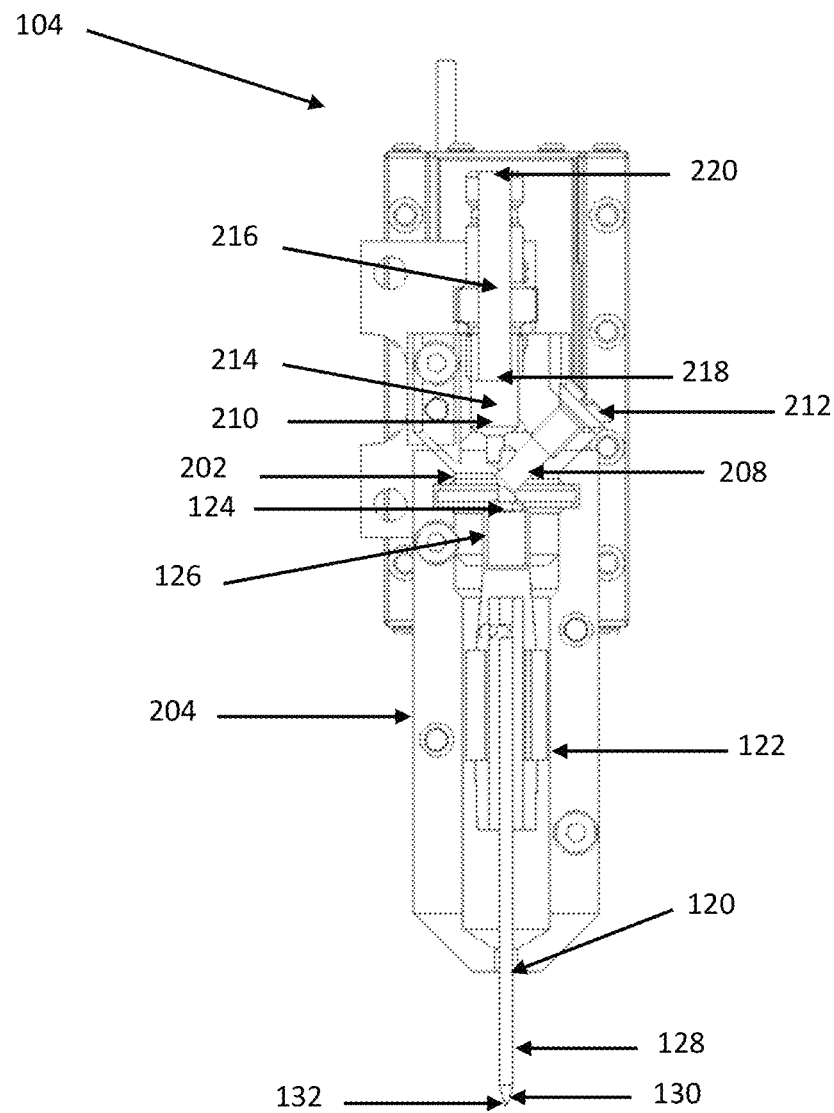
FIG. 6 is a cut-away schematic side view of a print head.

An example of a print head 104 is shown in FIG. 6. The print head 104 includes a nozzle 200. In the example shown, capillary glass tube 120 is configured as the nozzle 200. A portion of the nozzle 200, and its plastic handle 122, are encased in the external housing 204. The elongate input portion 128 extends downward from the external housing 204. An outlet 132 is located downward and downstream from the elongate input portion 128. The tapering portion 130 is located between the outlet 132 and the elongate input portion 128. The external housing 204 encases a main body 202, which includes a pneumatic conduit 210 and a fluid conduit 208. Both the pneumatic conduit 210 and the fluid conduit 208 are connected to the inlet 124 of the plastic handle 122. The plastic handle 122 is attached to the main body 202 by the threaded portion 126 of the plastic handle 122. The pneumatic conduit 210 has a threaded portion 214 on its input end which is used to attach the output end 218 of a pneumatic connector 216 thereto. The pneumatic connector 216 has an input end 220 to which the pneumatic system 106 is connected (not shown in FIG. 10). Fluid (for example, a metallic nanoparticle composition) is supplied to the nozzle (capillary glass tube 120) via the fluid conduit 208. As shown in FIG. 6, fluid conduit 208 is plugged with a fluid inlet plug 212, after fluid has been supplied to the nozzle 172. The metallic nanoparticle composition can be stored in the nozzle in the print head 104, or the metallic nanoparticle composition can be stored in a fluid reservoir that supplies ink to the print head 104 via the fluid conduit 208.

FIG. 2 shows a nozzle 200 after it has been installed in the print head 104 above the substrate 110 with the outlet (132, 38) pointing down toward the substrate 110. The pneumatic system 106 is coupled to the print head 104. Typically, the pneumatic system 106 includes a pump and a pressure regulator. The pneumatic system 106 may be capable of applying pressure in a range of 0 to 6 bar to the inlet of the nozzle. In the samples shown in Table 1, metallic nanoparticle compositions were dispensed under an applied pressure of 0 mbar or 25 mbar. Under the applied pressure, the metallic nanoparticle composition flows out from the outlet. The imaging system 114 captures images of the nozzle outlet and a portion of the substrate near the nozzle outlet. The imaging system 114 is used to monitor a vertical distance between the nozzle outlet and a surface 112 of the substrate 110.

The print head positioning system 108 controls the vertical displacement of the print head 104 and the lateral displacement of the print head 104 relative to the substrate. During dispensing of the metallic nanoparticle composition onto the substrate, the print head 104 is moved laterally from a start position to the end position. During the dispensing, the nozzle 200 is held at an angle ranging between 40° and 50°, or approximately 45°, from the plane of the substrate 110, such that the print head 104 runs ahead of the nozzle outlet. During dispensing of the metallic nanoparticle composition onto the substrate, the print head positioning system 108 maintains a vertical distance between the nozzle outlet and substrate surface in a range of approximately 1 μm and 10 μm.

What is claimed is:

1. A method of decreasing a sheet resistance of a transparent conductor, the method comprising:
    forming a first transparent conductor layer comprising a first crystalline metal oxide on a substrate;
    dispensing a metallic nanoparticle composition on the first transparent conductor layer to form metallic nanoparticle features on the first transparent conductor layer, wherein the metallic nanoparticle features comprise metallic nanoparticle lines on the first transparent conductor layer; and
    sintering at least the first transparent conductor layer and the metallic nanoparticle features;
    wherein an aperture ratio of the transparent conductor is in a range of 90% to 99%.

2. The method of claim 1, wherein the first transparent conductor layer has a thickness in a range of 10 nm to 1000 nm.

3. The method of claim 1, wherein the first crystalline metal oxide is selected from crystalline indium-tin oxide (c-ITO) and crystalline indium-zinc oxide (c-IZO).

4. The method of claim 1, wherein forming the first transparent conductor layer comprises depositing crystalline indium-tin oxide or crystalline indium-zinc oxide by radio frequency (RF) magnetron sputtering.

5. The method of claim 1, wherein forming the first transparent conductor layer comprises: (1) depositing amorphous indium-tin oxide by PVD (physical vapor deposition) evaporation and converting the amorphous indium-tin oxide to crystalline indium-tin oxide by heating, or (2) depositing amorphous indium-zinc oxide by PVD (physical vapor deposition) evaporation and converting the amorphous indium-zinc oxide to crystalline indium-zinc oxide by heating.

6. The method of claim 1, wherein the metallic nanoparticle lines have line widths in a range of 3 μm to 50 μm.

7. The method of claim 1, wherein:
    the first transparent conductor layer is characterized by a single sheet resistance before dispensing the metallic nanoparticle composition;
    a combination of the first transparent conductor layer and the metallic nanoparticle features is characterized by a bilayer sheet resistance after the sintering; and
    the bilayer sheet resistance is smaller than the single sheet resistance by 67% or more.

8. The method of claim 1, wherein sintering at least the first transparent conductor layer and the metallic nanoparticle features comprises photonic sintering the first transparent conductor layer and the metallic nanoparticle features.

9. The method of claim 1, wherein sintering at least the first transparent conductor layer and the metallic nanoparticle features comprises thermal sintering the first transparent conductor layer and the metallic nanoparticle features.

10. The method of claim 1, wherein dispensing the metallic nanoparticle composition on the first transparent conductor layer to form metallic nanoparticle features on the first transparent conductor layer comprises dispensing the metallic nanoparticle composition from a capillary tube to form the metallic nanoparticle lines on the first transparent conductor layer.

11. A method of forming a multilayer transparent conductor, the method comprising:

forming a first transparent conductor layer comprising a first crystalline metal oxide on a substrate;

dispensing a metallic nanoparticle composition on the first transparent conductor layer to form metallic nanoparticle features on the first transparent conductor layer, wherein the metallic nanoparticle features comprise metallic nanoparticle lines on the first transparent conductor layer;

sintering at least the first transparent conductor layer and the metallic nanoparticle features; and forming a second transparent conductor layer comprising a second crystalline metal oxide overlying the metallic nanoparticle features;

wherein an aperture ratio of the multilayer transparent conductor is in a range of 90% to 99%.

12. The method of claim 11, wherein forming the first transparent conductor layer and/or forming the second transparent conductor layer comprise depositing crystalline indium-tin oxide or crystalline indium-zinc oxide by radio frequency (RF) magnetron sputtering.

13. The method of claim 11, wherein forming the first transparent conductor layer and/or forming the second transparent conductor layer comprise: (1) depositing amorphous indium-tin oxide by PVD (physical vapor deposition) evaporation and converting the amorphous indium-tin oxide to crystalline indium-tin oxide by heating, or (2) depositing amorphous indium-zinc oxide by PVD (physical vapor deposition) evaporation and converting the amorphous indium-zinc oxide to crystalline indium-zinc oxide by heating.

14. The method of claim 11, wherein the metallic nanoparticle lines have line widths in a range of 3 μm to 50 μm.

15. The method of claim 11, wherein forming the second transparent conductor layer is carried out after the sintering.

16. The method of claim 11, wherein:

the first transparent conductor layer is characterized by a single sheet resistance before dispensing the metallic nanoparticle composition;

a combination of the first transparent conductor layer, the metallic nanoparticle features, and the second transparent conductor layer is characterized by a multilayer sheet resistance after the sintering; and the multilayer sheet resistance is smaller than the single sheet resistance by 67% or more.

17. The method of claim 11, wherein sintering at least the first transparent conductor layer and the metallic nanoparticle features comprises photonic sintering the first transparent conductor layer and the metallic nanoparticle features.

18. The method of claim 11, wherein sintering at least the first transparent conductor layer and the metallic nanoparticle features thermal sintering the first transparent conductor layer and the metallic nanoparticle features.

19. The method of claim 11, wherein dispensing the metallic nanoparticle composition on the first transparent conductor layer to form metallic nanoparticle features on the first transparent conductor layer comprises dispensing the metallic nanoparticle composition from a capillary tube to form the metallic nanoparticle lines on the first transparent conductor layer.

* * * * *